United States Patent
Yuan et al.

(10) Patent No.: US 12,317,684 B2
(45) Date of Patent: May 27, 2025

(54) ARRAY SUBSTRATE WITH OVERLAPPING ACTIVE LAYERS HAVING CHANNEL WIDTH GREATER THAN GATE WIDTH, METHOD FOR PREPARING THE SAME, AND DISPLAY PANEL

(71) Applicant: HKC CORPORATION LIMITED, Guangdong (CN)

(72) Inventors: Xin Yuan, Guangdong (CN); Xiufeng Zhou, Guangdong (CN); Chen Chen, Guangdong (CN); Lidan Ye, Guangdong (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/746,509

(22) Filed: Jun. 18, 2024

(65) Prior Publication Data
US 2025/0024707 A1    Jan. 16, 2025

(30) Foreign Application Priority Data

Jul. 10, 2023  (CN) .......................... 202310836246.1

(51) Int. Cl.
| | | |
|---|---|---|
| H10K 59/121 | (2023.01) | |
| H10K 59/12 | (2023.01) | |
| H10K 59/124 | (2023.01) | |
| H10D 86/40 | (2025.01) | |
| H10D 86/60 | (2025.01) | |

(52) U.S. Cl.
CPC ..... *H10K 59/1213* (2023.02); *H10K 59/1201* (2023.02); *H10K 59/124* (2023.02); *H10D 86/421* (2025.01); *H10D 86/60* (2025.01)

(58) Field of Classification Search
CPC .......... H10K 59/1213; H10K 59/1201; H10K 59/124; H01L 27/1222
See application file for complete search history.

(56) References Cited

U.S. PATENT DOCUMENTS

| | | | |
|---|---|---|---|
| 6,327,006 B1 | 12/2001 | Sato et al. | |
| 2005/0236618 A1* | 10/2005 | Toyoda ................. | H01L 27/127 257/E29.279 |
| 2014/0145177 A1 | 5/2014 | Lee et al. | |

(Continued)

FOREIGN PATENT DOCUMENTS

| | | |
|---|---|---|
| CN | 105097948 A | 11/2015 |
| CN | 106684103 A | 5/2017 |

(Continued)

OTHER PUBLICATIONS

Notice of Allowance of counterpart Chinese Patent Application No. 202310836246.1 issued on Jan. 3, 2024.

(Continued)

*Primary Examiner* — Lex H Malsawma

(57) ABSTRACT

The present application relates to the technical field of display panels, and provides an array substrate and a method for preparing the same, and a display panel. The array substrate includes a base substrate, a buffer layer, an active layer, a gate insulation layer, a first gate, an interlayer insulation layer, a source and a drain that are laminated. The active layer includes the first active layer and the two second active layers, and the first active layer forms the channel region.

11 Claims, 5 Drawing Sheets

(56) References Cited

U.S. PATENT DOCUMENTS

| | | | |
|---|---|---|---|
| 2016/0293643 A1 | 10/2016 | Kim et al. | |
| 2017/0005152 A1 | 1/2017 | Hong et al. | |
| 2017/0236844 A1 | 8/2017 | Yamazaki et al. | |
| 2019/0165002 A1* | 5/2019 | Cheng | G02F 1/133512 |
| 2019/0229017 A1 | 7/2019 | Liu et al. | |
| 2020/0168687 A1 | 5/2020 | Hu et al. | |
| 2020/0176604 A1* | 6/2020 | Xu | H01L 29/66969 |
| 2024/0072062 A1 | 2/2024 | Hu et al. | |

FOREIGN PATENT DOCUMENTS

| | | |
|---|---|---|
| CN | 107452808 A | 12/2017 |
| CN | 109686793 A | 4/2019 |
| CN | 109755259 A | 5/2019 |
| CN | 110289307 A | 9/2019 |
| CN | 210325749 U | 4/2020 |
| CN | 111312725 A | 6/2020 |
| CN | 113097295 A | 7/2021 |
| CN | 114883345 A | 8/2022 |
| CN | 114975631 A | 8/2022 |
| CN | 115274693 A | 11/2022 |
| CN | 115588696 A | 1/2023 |
| JP | 2017085079 A | 5/2017 |
| KR | 20060114863 A | 11/2006 |
| WO | 2021081992 A1 | 5/2021 |

OTHER PUBLICATIONS

First Office Action of counterpart Chinese Patent Application No. 202310836246.1 issued on Nov. 16, 2023.

* cited by examiner

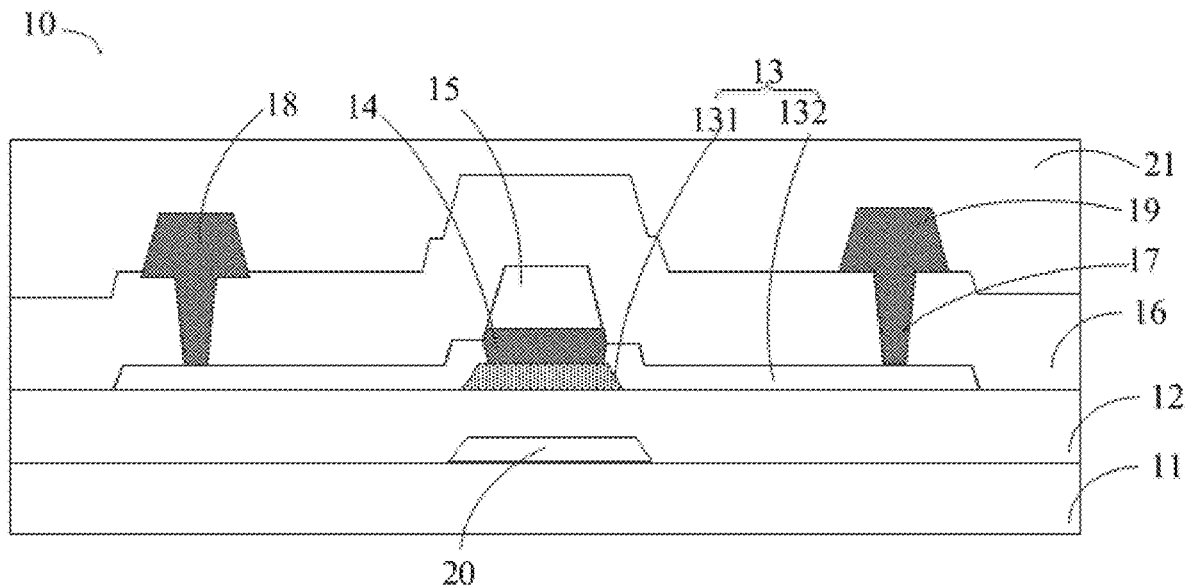

FIG. 4 sequentially depositing a buffer layer, an active layer, a gate insulation layer and a first gate on a base substrate along a first direction; and the active layer comprises a first active layer and two second active layers respectively located on two sides of the first active layer; — S10 conducting the two second active layers using the first gate as a mask; — S20 depositing an interlayer insulation layer to enable the interlayer insulation layer to cover the buffer layer, the gate, the two second active layers and the gate insulation layer; and exposing and developing on the interlayer insulation layer to form two through holes directly reaching the two conductive portions of the two second active layers, respectively; — S30 depositing a source and a drain on the interlayer insulation layer and in the two through holes. — S40

FIG. 5

ARRAY SUBSTRATE WITH OVERLAPPING ACTIVE LAYERS HAVING CHANNEL WIDTH GREATER THAN GATE WIDTH, METHOD FOR PREPARING THE SAME, AND DISPLAY PANEL

CROSS REFERENCE TO RELATED APPLICATION

Pursuant to 35 U.S.C. § 119 and the Paris Convention Treaty, this application claims the benefit of Chinese Patent Application No. 202310836246.1 filed Jul. 10, 2023, the contents of which are incorporated herein by reference.

TECHNICAL FIELD

The present application relates to the technical field of display panels, and more particularly to an array substrate and a method for preparing the same, and a display panel.

BACKGROUND

As an important component of a flat panel display device, a thin film transistor (TFT) can be formed on a glass substrate or a plastic substrate. TFT is usually used as a switching device and a driving device in a display apparatus, such as a liquid crystal display device (LCD) and an organic light emitting display (OLED).

When fabricating thin film transistors on a glass substrate or a plastic substrate, a gate is usually used as a conductive mask of the active layer to form a corresponding channel region. However, due to the diffusion phenomenon in different conductive processes, an actual width of the channel region is smaller than a width of the gate. Due to the definition requirements of the display panel, the size of the thin film transistor needs to be reduced as much as possible. If a difference between the width of the channel region and the width of the gate is too large, short-channel thin film transistors may lose their switching characteristics, therefore, the difference needs to be as small as possible. However, due to the diffusion effect, the difference cannot be ensured, and ultimately the switching characteristics requirements cannot be taken into account.

SUMMARY

An object of the present application is to provide an array substrate, aimed at solving the problem that traditional array substrates cannot meet the requirements of switching characteristics while meeting the clarity requirements.

In a first aspect of an embodiment of the present application, an array substrate is provided, and the array substrate includes:
a base substrate; and
a buffer layer, an active layer, a gate insulation layer, and a first gate that are sequentially laminated on the base substrate along a first direction, and the active layer includes a first active layer and two second active layers respectively located on two sides of the first active layer;
along the first direction, the two second active layers overlap with the two sides of the first active layer respectively, a channel region is formed on the first active layer, a conductive portion is formed on each of the two second active layers; and along a second direction, an extension width of the first active layer is greater than an extension width of the first gate, and the first direction intersects with the second direction;
an interlayer insulation layer is provided on the buffer layer, the interlayer insulation layer covers the first gate, the two second active layers and the gate insulation layer, and the interlayer insulation layer is provided with two through holes respectively arranged above the two second active layers; and
a source and a drain are respectively arranged on the interlayer insulation layer, and the source and the drain are respectively connected to the corresponding two conductive portions of the two second active layers through the two through holes.

In an embodiment, along the first direction, two sides of the first gate respectively coincide with one side of each of the two second active layers, the channel region is formed between parts of the second active layers coincided with the first gate and the first active layer, and the two conductive portions are formed at parts of the two second active layers that are not coincided with the first gate.

In an embodiment, along the second direction, the extension width of the first gate is less than an extension width of the gate insulation layer; and
the extension width of the first active layer is greater than the extension width of the gate insulation layer.

In an embodiment, the array substrate further includes:
a second gate, located between the base substrate and the buffer layer, the buffer layer covers the second gate, and along the second direction, an extension width of the second gate is greater than the extension width of the first gate.

In an embodiment, the array substrate further includes:
a passivation layer, covers the interlayer insulation layer, the source and the drain.

In a second aspect of an embodiment of the present application, a method for preparing an array substrate is provided, and the method includes steps as following:
sequentially depositing a buffer layer, an active layer, a gate insulation layer and a first gate on a base substrate along a first direction; where the active layer comprises a first active layer and two second active layers respectively located on two sides of the first active layer; along the first direction, the two second active layers overlap with the two sides of the first active layer respectively, and along a second direction, an extension width of the first active layer is greater than an extension width of the first gate, and the first direction intersects with the second direction;
conducting the two second active layers using the first gate as a mask; where a channel region is formed in the first active layer, and two conductive portions are respectively formed on the two second active layers;
depositing an interlayer insulation layer to enable the interlayer insulation layer to cover the buffer layer, the first gate, the two second active layers and the gate insulation layer; and exposing and developing on the interlayer insulation layer to form two through holes directly reaching the two conductive portions of the two second active layers, respectively; and
depositing a source and a drain on the interlayer insulation layer and in the two through holes.

In an embodiment, along the first direction, two sides of the first gate respectively coincide with one side of each of the two second active layers; and
the channel region is formed between parts of the second active layers coincided with the first gate and the first active layer, and the two conductive portions are formed at parts of the two second active layers that are not coincided with the first gate.

In an embodiment, the step of depositing sequentially to form the buffer layer, the active layer, the gate insulation layer and the first gate on the base substrate specifically includes:

sequentially depositing the buffer layer and the first active layer on the base substrate;

sequentially depositing the two second active layers at two side of the first active layer respectively, where along the first direction, the two second active layers overlap with two sides of the first active layer respectively;

etching the two second active layers along the second direction, such that a channel groove is formed by a part of the first active layer that is not overlapped with the two second active layers and edges of the two second active layers and configured for receiving the gate insulation layer; and depositing the gate insulation layer in the channel groove, and depositing the first gate on the gate insulation layer.

In an embodiment, the method further includes:

depositing a second gate on the base substrate; where the second gate is located between the base substrate and the buffer layer, the buffer layer covers the second gate, and along the second direction, an extension width of the second gate is greater than an extension width of the first gate; and depositing a passivation layer on the interlayer insulation layer, the source and the drain.

A third aspect of an embodiment of the present application provides a display panel, and the display panel includes: an OLED device and an array substrate; the OLED device is stacked above the array substrate, and the array substrate is the array substrate provided in the first aspect or the array substrate prepared based on the preparation method in the second aspect.

The first aspect of the embodiment of the present application provides the array substrate including the base substrate, the buffer layer, the active layer, the gate insulation layer, the first gate, the interlayer insulation layer, the source and the drain that are laminated. The active layer includes the first active layer and the two second active layers, and the first active layer forms the channel region. By using the first gate as a conductive mask for the active layer, the second active layer is conductive, which will not affect the extension width of the channel region of the first active layer, so that the width difference between the channel region and the first gate is within the preset range, the problem of excessive width difference caused by the diffusion phenomenon of the channel region is reduced. Thus, the switching characteristics requirements of thin film transistors and the clarity requirements of display panels can be simultaneously satisfied.

It can be understood that the beneficial effects of the second and third aspects mentioned above can be found in the relevant description of the first aspect, and which will not be further repeated here.

BRIEF DESCRIPTION OF THE DRAWINGS

In order to explain the embodiments of the present invention more clearly, a brief introduction regarding the accompanying drawings that need to be used for describing the embodiments of the present invention or the prior art is given below; it is obvious that the accompanying drawings described as follows are only some embodiments of the present invention, for those skilled in the art, other drawings can also be obtained according to the current drawings on the premise of paying no creative labor.

FIG. 4 is a fourth structural schematic diagram of an array substrate provided in an embodiment 1 of the present application;

FIG. 5 is a first schematic flowchart of a method for preparing the array substrate provided in an embodiment 2 of the present application;

Figure 1:
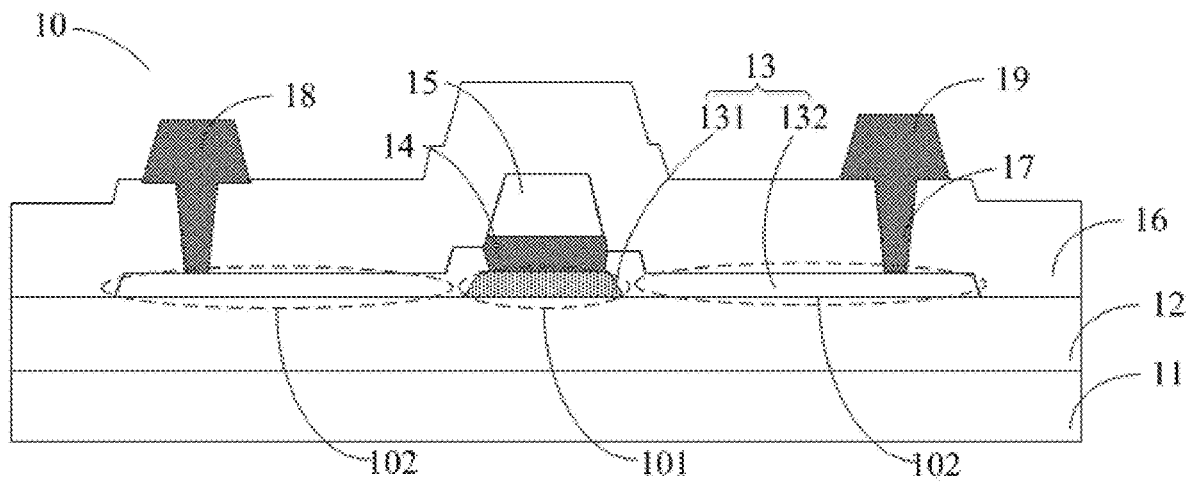
FIG. 1 is a first structural schematic diagram of an array substrate provided in an embodiment 1 of the present application.

In the drawings, the reference signs are listed:
1—second substrate; 2—OLED devices; 3—first substrate; 10—array substrate; 11—base substrate; 12—buffer layer; 13—active layer; 14—gate insulation layer; 15—first gate; 16—interlayer insulation layer; 17—through hole; 18—source; 19—drain; 20—second gate; 21—passivation layer; 131—first active layer; 132—second active layer, 101—channel region; 102—conductive portion.

DETAILED DESCRIPTION OF EMBODIMENTS

In order to make the technical problems, technical solutions, and beneficial effects to be solved by the present application clearer, the following is a further detailed explanation of present application in conjunction with the accompanying drawings and embodiments. It should be understood that the specific embodiments described here are only intended to explain the present application and are not intended to limit the present application.

It is noted that when a component is referred to as being "fixed to" or "disposed on" another component, it can be directly or indirectly on another component. When a component is referred to as being "connected to" another component, it can be directly or indirectly connected to another component.

It needs to be understood that, directions or location relationships indicated by terms such as "length", "width", "up", "down", "front", "rear", "left", "right", "vertical", "horizontal", "top", "bottom", "inside", "outside", and so on are the directions or location relationships shown in the accompanying figures, which are only intended to describe the present application conveniently and simplify the description, but not to indicate or imply that an indicated device or component must have specific locations or be constructed and manipulated according to specific locations; therefore, these terms shouldn't be considered as any limitation to the present application.

In addition, terms "the first" and "the second" are only used in describe purposes, and should not be considered as indicating or implying any relative importance, or impliedly indicating the number of indicated technical features. As such, technical feature(s) restricted by "the first" or "the second" can explicitly or impliedly comprise one or more such technical feature(s). In the description of the present application, "a plurality of" means two or more, unless there is additional explicit and specific limitation.

Embodiment 1

As shown in FIG. 1, a first aspect of the embodiment of the present application provides an array substrate 10, which includes:

a base substrate 11; and
a buffer layer 12, an active layer 13, a gate insulation layer 14, and a first gate 15 that are sequentially laminated on the base substrate 11 along a first direction, the active layer 13 includes a first active layer 131 and two second active layers 132 respectively located on two sides of the first active layer 131;
along the first direction, the two second active layers 132 overlap with the two sides of the first active layer 131 respectively, a channel region 101 is formed on the first active layer 131, a conductive portion 102 is formed on each of the two second active layers 132; and along a second direction, an extension width of the first active layer 131 is greater than an extension width of the first gate 15, and the first direction intersects with the second direction;
an interlayer insulation layer 16 is provided on the buffer layer 12, the interlayer insulation layer 16 covers the first gate 15, the two second active layers 132 and the gate insulation layer 14, and the interlayer insulation layer 16 is provided with two through holes 17 respectively arranged above the two second active layers 132; and
a source 18 and a drain 19 are respectively arranged on the interlayer insulation layer 16, and the source 18 and the drain 19 are respectively connected to the corresponding two conductive portions 102 of the two second active layers 132 through the two through holes 17.

In the embodiment, when the thin film transistor is manufactured, the buffer layer 12, the first active layer 131, and the two second active layers 132 are laminated on the base substrate 11 along the first direction, and the two second active layer 132 are arranged on two sides of the first active layer 131, respectively, and the first active layer 131 and the two second active layers 132 are oxidized semiconductors. The edges on two sides of the first active layer 131 overlap with the edges of two second active layers 132 respectively, that is, the two second active layers 132 cover part of the first active layer 131 respectively, and the middle position of the first active layer 131 is not covered by the two second active layers 132. A gate insulation layer 14 is arranged on a part of the first active layer 131 which is not covered by the two second active layers 132, and a first gate 15 is laminated on the first active layer 14, and then a mask plate of preset size is used for exposing and developing directly above the first gate 15 to form a gate insulation layer 14 and a first gate 15 of the same size. Then the gate insulation layer 14 and the first gate 15 are etched to form the gate insulation layer 14 of the preset extension width and the first gate 15 of the preset extension width, so that the distance between widths of the gate insulation layer 14 and the first gate 15 is within the preset range.

Figure 2:
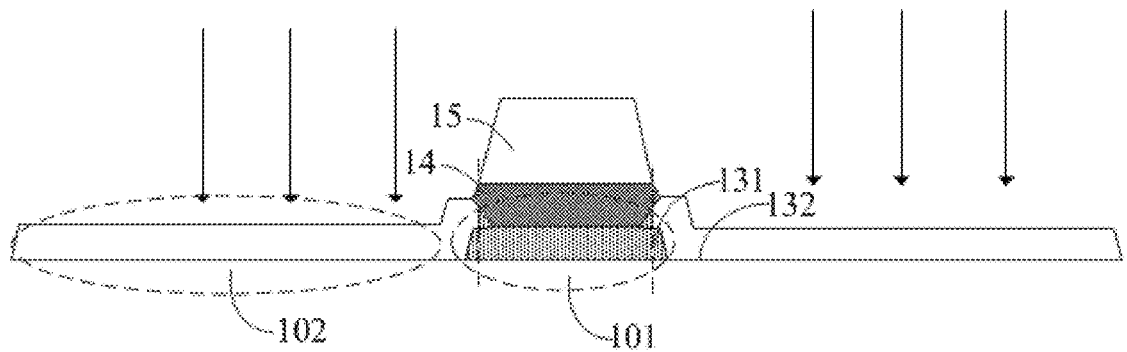
FIG. 2 is a second structural schematic diagram of an array substrate provided in an embodiment 1 of the present application.

Then, the first gate 15 is used as the conducting mask to carry out the conducting of the two second active layers 132. Due to the overlapping portion between the first gate 15 and the two second active layers 132 respectively, and the first active layer 131 is covered by the gate insulation layer 14 and the two second active layers 132 respectively, the gate insulation layer 14 and the second active layer 132 can protect the first active layer 131 to prevent the first active layer 131 from being bombarded by plasma, which will shorten the width of the channel region 101 of the first active layer 131, so as to further avoid the short channel effect of the thin film transistor. Therefore, as shown in FIG. 2, the two second active layers 132 form the conductive material and constitute the two conductive portions 102 of the two second active layers 132, while the first active layer 131 remains as the oxidized semiconductor and constitutes the channel region 101 of the thin film transistor, and the interlayer insulation layer 16 is laminated on top of the first gate 15, the gate insulation layer 14 and the second active layer 132. The through hole 17 is correspondingly formed on the interlayer insulation layer 16, and the source 18 and the drain 19 are formed by depositing in the through hole 17 and on the interlayer insulation layer 16, and the source 18 and the drain 19 are connected to the two second active layers 132 through two through holes 17 respectively. The drain 19, the two second active layers 132, the first active layer 131, the first gate 15 and the source 18 form the current loop of the thin film transistor.

By adjusting the extension width of the first active layer 131 to be greater than the extension width of the first gate 15, and covering the first active layer 131 with the two second active layers 132 and the gate insulator layer 14, the length of the effective channel region 101 of the first active layer 131 will not be affected under the unchanged conducting process. The distance between the extension width of the effective channel region 101 and the extension width of the first gate 15 can still be within the preset range under the limited diffusion effect. On the premise that the size of the thin film transistor is small enough to meet the clarity of the display panel, the extension width of the channel region 101 is close to the extension width of the first gate 15, so as to avoid the thin film transistor losing its switching characteristics due to short channels. It can meet both the switching characteristics of the thin film transistor and the clarity requirements of the display panel.

In the embodiment, along the first direction, two sides of the first gate 15 can overlap with parts of the two second active layers 132, or without overlap with the two second active layers 132, in order to ensure the length of the effective channel region 101 of the first active layer 131 and avoid the gap between the two second active layers 132 and the first gate 15 to bombard the first active layer 131 by the plasma through the gap during the conducting process. Optionally, as shown in FIG. 2, along the first direction, the two sides of the first gate 15 respectively coincide with the two sides of the two second active layers 132, and when conducting the second active layer 132, the plasma cannot bombardment the part of the two second active layer 132 that coincide with the first gate 15, and the parts of the two second active layers 132 that overlapped with the first gate 15 remain as the oxidized semiconductor, the parts of the two second active layers that overlapped with the first gate 15 form the channel region 101 with the first active layer 131, while the parts of the two second active layers that did not overlap with the first gate 15 are conducted to form the conductive material, so as to form the conductor portions 102 of the two second active layers 132.

In order to achieve effective coverage of the first active layer 131, a channel groove is formed between the part of the first active layer 131 that is not overlapped with the two second active layers 132 and edge portions of the two second active layers 132 and configured for receiving the gate insulation layer 14, the edge portions of the two second active layers 132 constitute the sides of the channel groove, and the middle portion of the first active layer 131 constitutes the bottom of the channel groove.

Correspondingly, along the second direction, the extension width of the first active layer 131 is greater than the extension width of the gate insulation layer 14, and the gate insulation layer 14 and the second active layer 132 completely cover the first active layer 131, which can avoid conducting the first active layer 131 under conducting. Thus, the distance between the extension width of the effective channel region 101 of the first active layer 131 and the extension width of the first gate 15 is within the preset range, which can simultaneously meet the switching characteristics of the thin film transistor and the clarity requirements of the display panel. At the same time, in order to improve the insulation effect between the two second active layers 132 and the first gate 15, and improve the electrical characteristics of the thin film transistor, the extension width of the gate insulation layer 14 is greater than the extension width of the first gate 15, and correspondingly, the edge portion of the gate insulation layer 14 also overlaps with the edge portions of the two second active layers 132.

In the embodiment, the extension width of the first active layer 131 can be set according to the switching characteristics and the size of the thin film transistor. On the premise that the extension width of the first active layer 131 is greater than the extension width of the first gate 15, the difference between the extension width of the first active layer 131 and the extension width of the first gate 15 can be set according to the diffusion effect and the switching characteristics of the thin film transistor.

Figure 3:
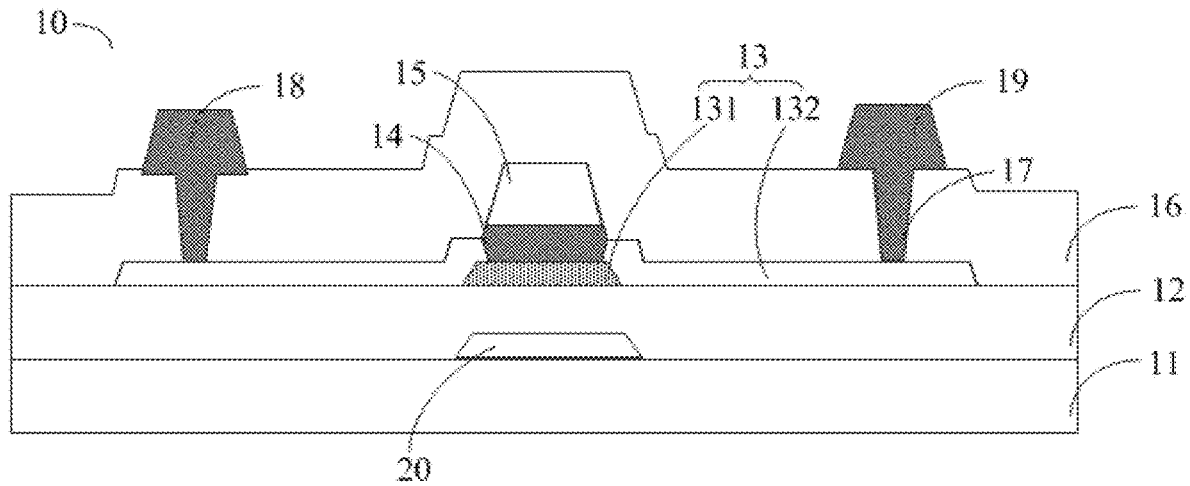
FIG. 3 is a third structural schematic diagram of an array substrate provided in an embodiment 1 of the present application.

Further, in order to increase the diversity of thin film transistors, as shown in FIG. 3, the array substrate 10 optionally includes:

a second gate 20, located between the base substrate 11 and the buffer layer 12, the second gate 20 covers the second gate 20, and the extension width of the second gate 20 is greater than the extension width of the first gate 15 along the second direction.

In the embodiment, the source 18, the drain 19, the active layer 13 and the second gate 20 constitute a bottom-gate structure thin film transistor, and the source 18, the drain 19, the active layer 13 and the first gate 15 constitute a top-gate structure thin film transistor, and a dual-gate structure thin film transistor is formed by providing the first gate 15 and the second gate 20. Under different electrical connection requirements, a corresponding gate structure can be selected for the connection and arrangement of the thin film transistor to improve the diversity of the thin film transistor.

Further, in order to improve the overall electrical characteristics of the thin film transistor, as shown in FIG. 4, the array substrate 10 also includes a passivation layer 21, in which the passivation layer 21 covers the interlayer insulation layer 16, the source 18 and the drain 19 to achieve the overall insulation of the thin film transistor and improve the electrical insulation characteristics of the thin film transistor.

The switching control of the thin film transistor is realized by providing a hole in the passivation layer 21 and connecting to the corresponding module by a lead wire.

The beneficial effects of the embodiment of the present application embodiment compared to the prior art are that the array substrate 10 includes the base substrate 11, the buffer layer 12, the active layer 13, the gate insulation layer 14, the first gate 15, the interlayer insulation layer 16, the source 18 and the drain 19 that are laminated. The active layer 13 includes the first active layer 131 and the two second active layers 132, and the first active layer 131 forms the channel region 101. By using the first gate 15 as a conductive mask for the active layer 13, the second active layers 132 are conductive, which will not affect the extension width of the channel region 101 of the first active layer 131, so that the width difference between the channel region 101 and the first gate 15 is within the preset range, the problem of excessive width difference caused by the diffusion phenomenon of the channel region 101 is reduced. Thus, the switching characteristics requirements of thin film transistors and the clarity requirements of display panels can be simultaneously satisfied.

Embodiment 2

In the second aspect of the embodiment of the present application, a method for preparing an array substrate 10 is proposed, as shown in FIG. 5, the method includes:

Step S10: sequentially depositing a buffer layer 12, an active layer 13, a gate insulation layer 14 and a first gate 15 on a base substrate along a first direction; and the active layer 13 includes a first active layer 131 and two second active layers 132 respectively located on two sides of the first active layer 131; along the first direction, the two second active layers 132 overlap with the two sides of the first active layer 131 respectively, and along a second direction, an extension width of the first active layer 131 is greater than an extension width of the first gate 15, and the first direction intersects with the second direction.

In the embodiment, when the thin film transistor is manufactured, the buffer layer 12, the first active layer 131, and the two second active layers 132 are laminated and deposited on the base substrate 11 along the first direction, and the two second active layer 132 are arranged on two sides of the first active layer 131, respectively, and the first active layer 131 and the two second active layers 132 are oxidized semiconductors. The edges on two sides of the first active layer 131 overlap with the edges of the two second active layers 132 respectively, that is, the two second active layers 132 cover part of the first active layer 131 respectively, and the middle position of the first active layer 131 is not covered by the two second active layers 132. A gate insulation layer 14 is arranged on a part of the first active layer 131 which is not covered by the two second active layers 132, and a first gate 15 is laminated on the first active layer 14, and then a mask plate of preset size is used for exposing and developing directly above the first gate 15 to form a gate insulation layer 14 and a first gate 15 of the same size. Then the gate insulation layer 14 and the first gate 15 are etched to form the gate insulation layer 14 of the preset extension width and the first gate 15 of the preset extension width, so that the distance between widths of the gate insulation layer 14 and the first gate 15 is within the preset range.

Figure 6:
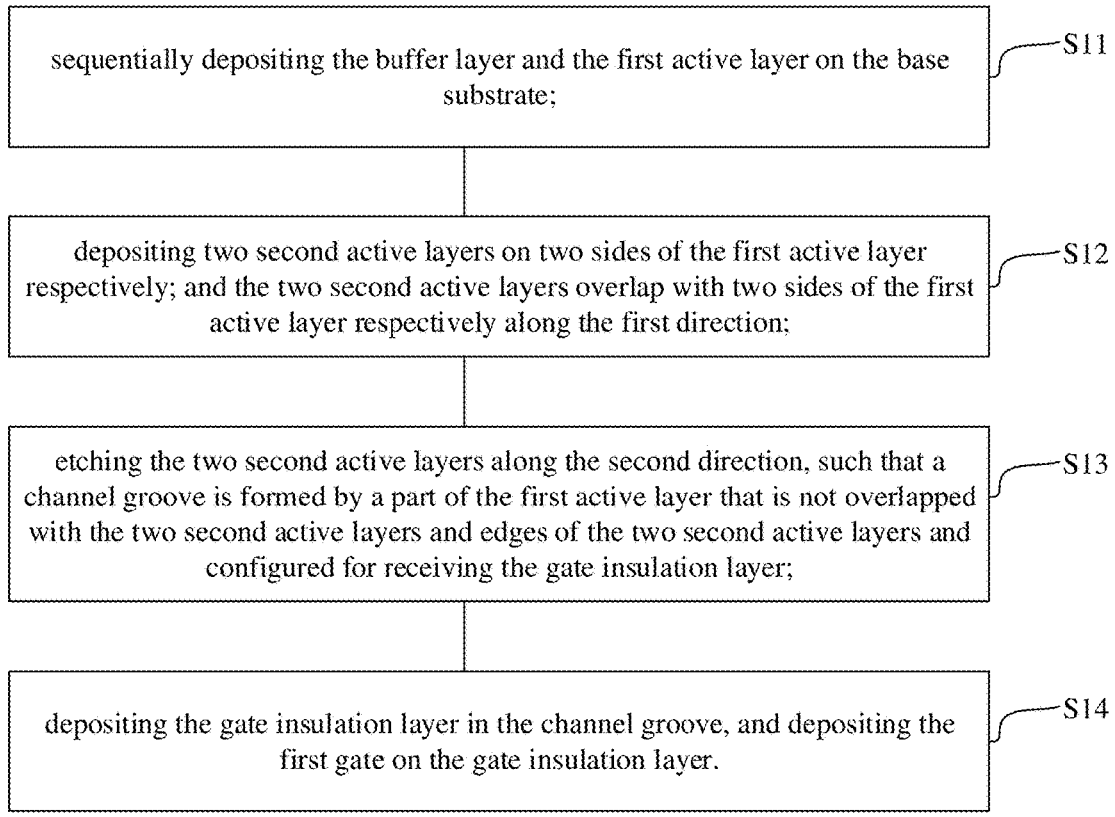
FIG. 6 is a specific schematic flowchart of a step S10 provided in the embodiment 2 of the present application.
Figure 7:
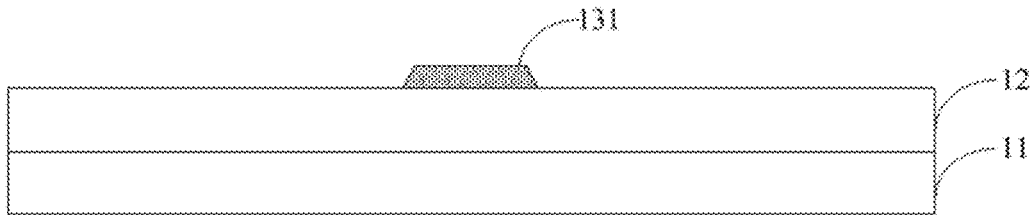
FIG. 7 is a specific schematic flowchart of a step S11 provided in the embodiment 2 of the present application.

In order to realize the setting mode of the first active layer 131 and the two second active layers 132, optionally, as shown in FIG. 6, step S10 includes:

In step S11, as shown in FIG. 7, sequentially depositing the buffer layer 12 and the first active layer 131 on the base substrate 11; the buffer layer 12 and the first active layer 131 can be formed by chemical vapor deposition or physical vapor deposition. When initially formed, the extension width of the first active layer 131 is the same as that of the buffer layer 12. In order to form the first active layer 131 of the corresponding size and shape, the first active layer 131 of the initial deposition is etched, exposed and developed, so as to form the first active layer 131 with extension width being greater than the extension width of the first gate 15.

Figure 8:
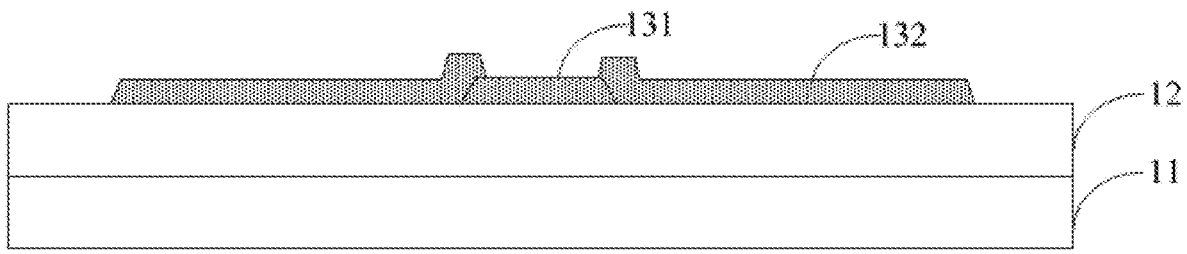
FIG. 8 is a specific schematic flowchart of a step S12 provided in the embodiment 2 of the present application.

In step S12, as shown in FIG. 8, depositing two second active layers 132 on two sides of the first active layer 131 respectively; and the two second active layers 132 overlap with two sides of the first active layer 131 respectively along the first direction. The second active layers 132 can be deposited in various ways, such as the second active layers 132 are deposited on two sides of the first active layer 131 respectively. Then the second active layers 132 on two sides are etched, exposed and developed to form the corresponding shape of the second active layers 132, or the second active layer 132 is deposited on the buffer layer 12 and the first active layer 131, and the second active layer 132 covers the first active layer 131 as a whole. Then, the second active layer 132 located above the first active layer 131 is removed by etching, exposing and developing, so as to form the two second active layers 132 located on two sides of the first active layer 131.

Figure 9:
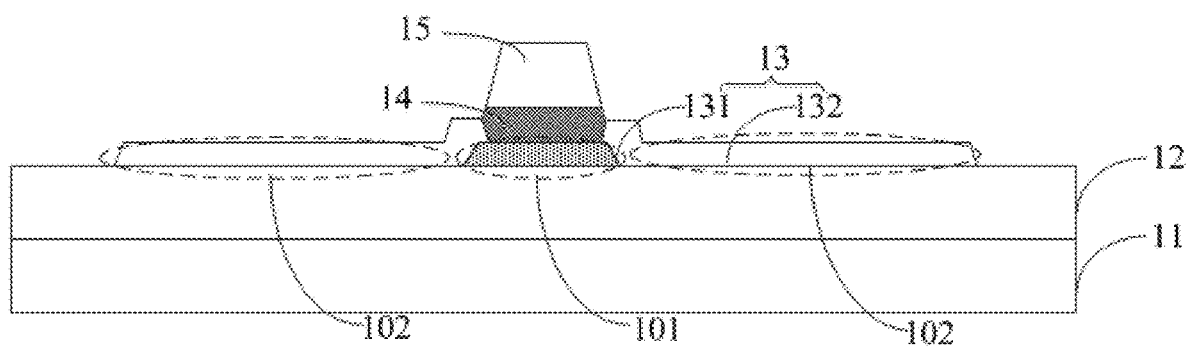
FIG. 9 is a specific schematic flowchart of a step S14 provided in the embodiment 2 of the present application.

In step S13, etching the two second active layers 132 along the second direction, such that a channel groove is formed by a part of the first active layer 131 that is not overlapped with the two second active layers 132 and edges of the two second active layers 132 and configured for receiving the gate insulation layer 14;

In step S14, as shown in FIG. 9, depositing the gate insulation layer 14 in the channel groove, and depositing the first gate 15 on the gate insulation layer 14.

After the first active layer 131 and the second active layers 132 are formed, the second active layer 132 is etched or exposed and developed to form the channel groove, the edge parts of the second active layers 132 form the sides of the channel groove, the middle part of the first active layer 131 forms the bottom of the channel groove, and then the gate insulation layer 14 is deposited on the channel groove, and the first gate 15 is deposited on the gate insulation layer 14. The sizes of the gate insulation layer 14 and the first gate 15 are the same as that of the active layer 13 at the initial deposition. In order to form the gate insulation layer 14 and the first gate 15 of the corresponding shape and size, a mask of the corresponding size is arranged above the first gate 15. The gate insulation layer 14 and the first gate 15 of the same size are formed by exposing and developing, and further, the gate insulation layer 14 with a preset extension width and the first gate 15 with a preset extension width are formed along the second direction by improving the etching process.

Figure 10:
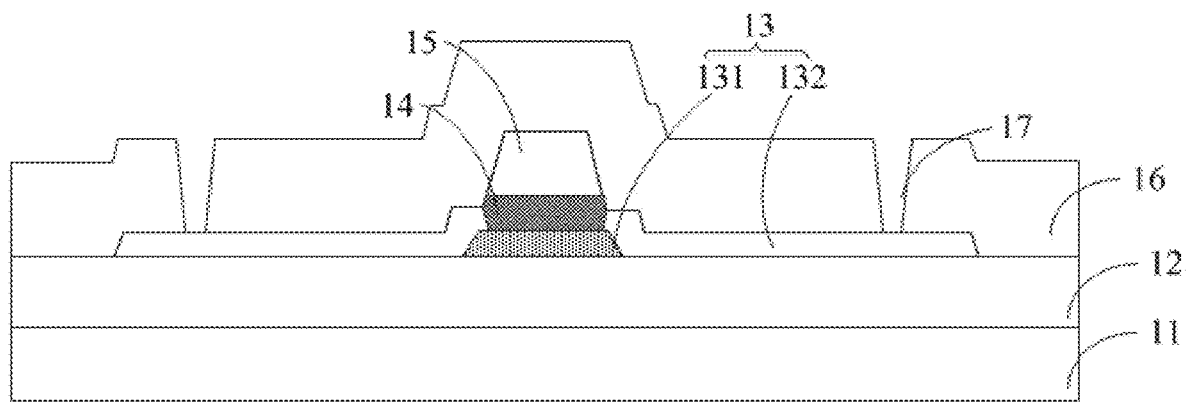
FIG. 10 is a specific schematic flowchart of a step S30 provided in the embodiment 2 of the present application.

In step S20, as shown in FIG. 2, conducting the two second active layers 132 using the first gate 15 as a mask; and a channel region 101 is formed in the first active layer 131, and two conductive portions 102 are respectively formed on the two second active layers 132;

In step S30, as shown in FIG. 10, depositing an interlayer insulation layer 16 covering the buffer layer 12, the first gate 15, the two second active layers 132 and the gate insulation layer 14; and exposing and developing on the interlayer insulation layer 16 to form two through holes 17 directly corresponding to the two conductive portions 102 of the two second active layers 132;

In step S40, as shown in FIG. 1, depositing a source 18 and a drain 19 on the interlayer insulation layer 16 and in the two through holes 17.

The first gate 15 is used as the conducting mask to carry out the conducting of the two second active layers 132. Due to the overlapping portion between the first gate 15 and the two second active layers 132 respectively, and the first active layer 131 is covered by the gate insulation layer 14 and the two second active layers 132 respectively, the gate insulation layer 14 and the second active layer 132 can protect the first active layer 131 to prevent the first active layer 131 from being bombarded by plasma, which will shorten the width of the channel region 101 of the first active layer 131, so as to further avoid the short channel effect of the thin film transistor. Therefore, as shown in FIG. 2, the two second active layers 132 form the conductive material and constitute the two conductive portions 102 of the two second active layers 132, while the first active layer 131 remains as the oxidized semiconductor and constitutes the channel region 101 of the thin film transistor.

Then the interlayer insulation layer 16 is laminated on top of the first gate 15, the gate insulation layer 14 and the second active layer 132, the through hole 17 is correspondingly formed on the interlayer insulation layer 16, which directly reaches the conductive portions 102 of the two second active layers 132; and the source 18 and the drain 19 are formed by depositing in the through hole 17 and on the interlayer insulation layer 16, and the source 18 and the drain 19 are connected to the two second active layers 132 through two through holes 17 respectively. The drain 19, the two second active layers 132, the first active layer 131, the first gate 15 and the source 18 form the current loop of the thin film transistor.

By adjusting the extension width of the first active layer 131 to be greater than the extension width of the first gate 15, and covering the first active layer 131 with the two second active layers 132 and the gate insulator layer 14, the length of the effective channel region 101 of the first active layer 131 will not be affected under the unchanged conducting process. The distance between the extension width of the effective channel region 101 and the extension width of the first gate 15 can still be within the preset range under the limited diffusion effect. On the premise that the size of the thin film transistor is small enough to meet the clarity of the display panel, the extension width of the channel region 101 is close to the extension width of the first gate 15, so as to avoid the thin film transistor losing its switching characteristics due to short channels. It can meet both the switching characteristics of the thin film transistor and the clarity requirements of the display panel.

In the embodiment, along the first direction, two sides of the first gate 15 can overlap with parts of the two second active layers 132, or without overlap with the two second active layers 132, in order to ensure the length of the effective channel region 101 of the first active layer 131 and avoid the gap between the two second active layers 132 and the first gate 15 to bombard the first active layer 131 by the plasma through the gap during the conducting process. Optionally, as shown in FIG. 2, along the first direction, the two sides of the first gate 15 respectively coincide with the two sides of the two second active layers 132;

The parts of the two second active layers 132 that coincide with the first gate 15 and the first active layer 131 form the channel region 101, and the parts of the two second active layers 132 that do not coincide with the first gate 15 forms the conductive portions 102.

When conducting the second active layer 132, the plasma cannot bombardment the part of the two second active layer 132 that coincide with the first gate 15, and the parts of the two second active layers 132 that overlapped with the first gate 15 remain as the oxidized semiconductor, the parts of the two second active layers that overlapped with the first gate 15 form the channel region 101 with the first active layer 131, while the parts of the two second active layers that did not overlap with the first gate 15 are conducted to form the conductive material, so as to form the conductor portions 102 of the two second active layers 132.

The gate insulation layer 14 and the second active layer 132 completely cover the first active layer 131, which can avoid conducting the first active layer 131 under conducting. Thus, the distance between the extension width of the effective channel region 101 of the first active layer 131 and the extension width of the first gate 15 is within the preset range, which can simultaneously meet the switching characteristics of the thin film transistor and the clarity requirements of the display panel. At the same time, in order to improve the insulation effect between the two second active layers 132 and the first gate 15, and improve the electrical characteristics of the thin film transistor, the extension width of the gate insulation layer 14 is greater than the extension width of the first gate 15, and correspondingly, the edge portion of the gate insulation layer 14 also overlaps with the edge portions of the two second active layers 132.

In the embodiment, the extension width of the first active layer 131 can be set according to the switching characteristics and the size of the thin film transistor. On the premise that the extension width of the first active layer 131 is greater than the extension width of the first gate 15, the difference between the extension width of the first active layer 131 and the extension width of the first gate 15 can be set according to the diffusion effect and the switching characteristics of the thin film transistor.

Figure 11:
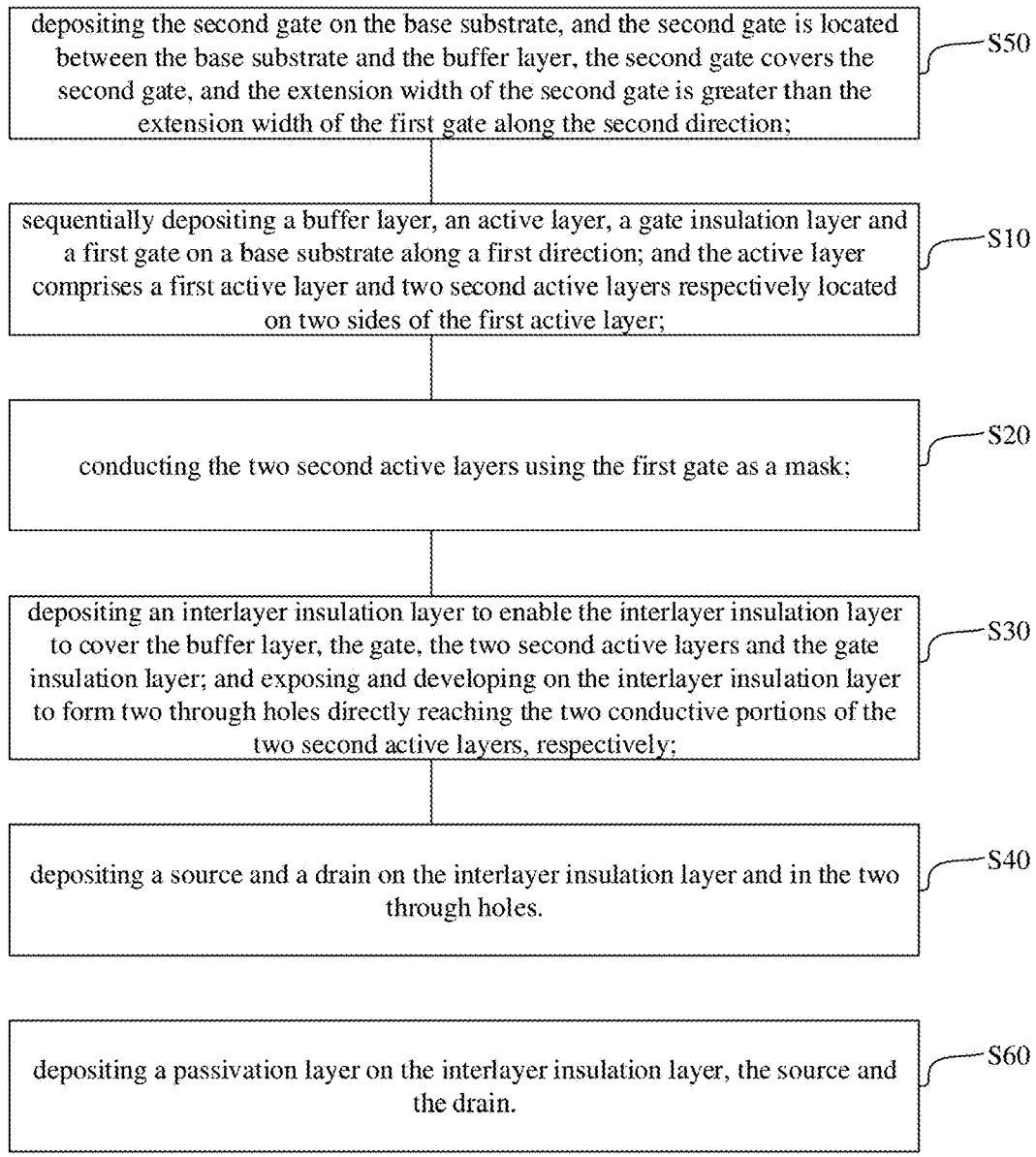
FIG. 11 is a second schematic flowchart of a method for preparing the array substrate provided in an embodiment 2 of the present application.

Further, in order to improve the diversity of the thin film transistor, as shown in FIGS. 3 and 11, the method for preparing the array substrate 10 further optionally includes:

In step S50, depositing the second gate 20 on the base substrate 11, and the second gate 20 is located between the base substrate 11 and the buffer layer 12, the second gate 20 covers the second gate 20, and the extension width of the second gate 20 is greater than the extension width of the first gate 15 along the second direction.

In the embodiment, the source 18, the drain 19, the active layer 13 and the second gate 20 constitute a bottom-gate structure thin film transistor, and the source 18, the drain 19, the active layer 13 and the first gate 15 constitute a top-gate structure thin film transistor, and a dual-gate structure thin film transistor is formed by providing the first gate 15 and the second gate 20. Under different electrical connection requirements, a corresponding gate structure can be selected for the connection and arrangement of the thin film transistor to improve the diversity of the thin film transistor.

In the embodiment, the step of depositing the second gate 20 is performed before the step S10, that is, after depositing the second gate 20, the buffer layer 12 is deposited, the buffer layer 12 covers the second gate 20, and then the first active layer 131, the second active layers 132, the gate insulation layer 14, the first gate 15, the interlayer insulation layer 16, the source 18 and the drain 19 are deposited sequentially.

Further, in order to improve the overall electrical characteristics of the thin film transistor, as shown in FIGS. 4 and 11, the method for preparing the array substrate 10 further optionally includes:

In step S60, depositing a passivation layer 21 on the interlayer insulation layer 16, the source 18 and the drain 19.

In the embodiment, the passivation layer 21 covers the interlayer insulation layer 16, the source 18 and the drain 19 to achieve the overall insulation of the thin film transistor and improve the electrical insulation characteristics of the thin film transistor. The switching control of the thin film transistor is realized by providing a hole in the passivation layer 21 and connecting to the corresponding module by a lead wire.

It should be understood that the sequence number of the steps in the above embodiments does not imply the order of execution, and that the order of execution of each process shall be determined by its function and internal logic, and shall not constitute any limitation on the implementation process of the embodiments the present application.

Embodiment 3

Figure 12:
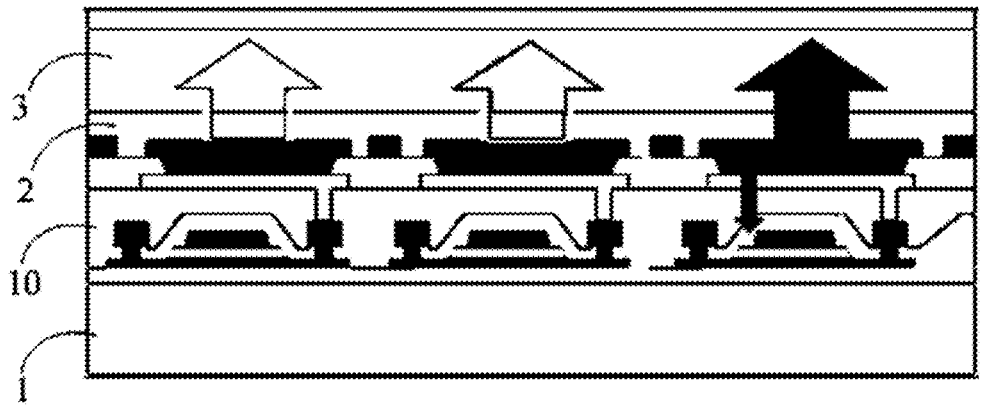
FIG. 12 is a structural schematic diagram of a display panel provided in an embodiment 3 of the present application.

As shown in FIG. 12, the third aspect of the embodiment the present application proposes a display panel, which includes an OLED device 2 and an array substrate 10. The specific structure and preparation method of the array substrate 10 refer to the above embodiments. Since the display panel adopts all the technical schemes of all the above embodiments, Thus, all the beneficial effects of technical solutions with at least the above embodiments will not be described here. In the embodiment, the OLED device is stacked above the array substrate 10.

The array substrate 10 includes a plurality of thin film transistors, and the plurality of thin film transistors constitute the corresponding unit drive circuit, which is connected with the OLED device 2 to form a single sub-pixel, and the OLED device 2 lights up according to the drive signal output by the unit drive circuit, and finally displays the corresponding image information.

Optionally, a simplified schematic diagram of the OLED display panel is shown in FIG. 3, which also includes a first substrate 3 and a second substrate 1;

The first substrate 3, the OLED device 2, the array substrate 10 and the second substrate 1 are laminated sequentially, the array substrate 10 includes a plurality of thin film transistors, the first substrate 3 and the second substrate 1 play a fixed role, the first substrate 3 and the second substrate 1 can choose to use the transparent material of the corresponding material, optionally, in order to ensure light transmission, optionally, the first substrate 3 and the second substrate 1 are glass substrates.

The above embodiments are used only to illustrate the technical solution of this application and not to limit the technical solutions of the present application. Although the present application has been explained in detail with reference to the above-described embodiments, it should be understood for the ordinary skilled one in the art that, the technical solutions described in each of the above-described embodiments can still be amended, or some technical features in the technical solutions can be replaced equivalently; these amendments or equivalent replacements, which won't make the essence of corresponding technical solution to be broken away from the spirit and the scope of the technical solution in various embodiments of the present application, should all be included in the protection scope of the present application.

What is claimed is:

1. An array substrate comprising:
a base substrate; and a buffer layer, an active layer, a gate insulation layer, and a first gate that are sequentially laminated on the base substrate along a first direction, where the active layer comprises a first active layer and two second active layers respectively located on two sides of the first active layer; and wherein the two second active layers are respectively deposited at two sides of the first active layer;

wherein along the first direction, the two second active layers overlap with the two sides of the first active layer respectively, the first gate is a conductive mask of the second active layer, the first active layer remains as an oxide semiconductor and forms a channel region, a conductive portion is formed on each of the two second active layers, and the two second active layers are made of conductor material; and along a second direction, an extension width of the first active layer is greater than an extension width of the first gate, and the first direction intersects with the second direction;

wherein an interlayer insulation layer is provided on the buffer layer, the interlayer insulation layer covers the first gate, the two second active layers and the gate insulation layer; and the interlayer insulation layer is provided with two through holes respectively arranged above the two second active layers;

wherein a source and a drain are respectively arranged on the interlayer insulation layer, and the source and the drain are respectively connected to the corresponding two conductive portions of the two second active layers through the two through holes; and wherein along the first direction, two sides of the first gate respectively coincide with one side of each of the two second active layers, the channel region is formed between parts of the second active layers coincided with the first gate and the first active layer, and the two conductive portions are formed at parts of the two second active layers that are not coincided with the first gate.

2. The array substrate according to claim 1, wherein along the second direction, the extension width of the first gate is less than an extension width of the gate insulation layer; and
the extension width of the first active layer is greater than the extension width of the gate insulation layer.

3. The array substrate according to claim 1, wherein the array substrate further comprises:
a second gate, located between the base substrate and the buffer layer, the buffer layer covers the second gate, and along the second direction, an extension width of the second gate is greater than the extension width of the first gate.

4. The array substrate according to claim 1, wherein the array substrate further comprises:
a passivation layer, covering the interlayer insulation layer, the source and the drain.

5. A method for preparing an array substrate, comprising:
sequentially depositing a buffer layer, an active layer, a gate insulation layer and a first gate on a base substrate along a first direction; wherein the active layer comprises a first active layer and two second active layers respectively located on two sides of the first active layer;
along the first direction, the two second active layers overlap with the two sides of the first active layer respectively, and along a second direction, an extension width of the first active layer is greater than an extension width of the first gate, and the first direction intersects with the second direction;

conducting the two second active layers using the first gate as a mask; wherein the first active layer remains as an oxide semiconductor and forms a channel region, and two conductive portions made of conductor material are respectively formed on the two second active layers;
depositing an interlayer insulation layer to enable the interlayer insulation layer to cover the buffer layer, the first gate, the two second active layers and the gate insulation layer; and
exposing and developing on the interlayer insulation layer to form two through holes directly reaching the two conductive portions of the two second active layers, respectively;
depositing a source and a drain on the interlayer insulation layer and in the two through holes;
wherein along the first direction, two sides of the first gate respectively coincide with one side of each of the two second active layers; and
the channel region is formed between parts of the second active layers coincided with the first gate and the first active layer, and the two conductive portions are formed at parts of the two second active layers that are not coincided with the first gate;
wherein the step of depositing sequentially to form the buffer layer, the active layer, the gate insulation layer and the first gate on the base substrate specifically comprises:
sequentially depositing the buffer layer and the first active layer on the base substrate; and
sequentially depositing the two second active layers at two sides of the first active layer respectively, wherein along the first direction, the two second active layers overlap with two sides of the first active layer respectively.

6. The method for preparing the array substrate according to claim 5, wherein the step of depositing sequentially to form the buffer layer, the active layer, the gate insulation layer and the first gate on the base substrate further comprises:
etching the two second active layers along the second direction, such that a channel groove is formed by a part of the first active layer that is not overlapped with the two second active layers and edges of the two second active layers and configured for receiving the gate insulation layer; and
depositing the gate insulation layer in the channel groove, and depositing the first gate on the gate insulation layer.

7. The method for preparing the array substrate according to claim 5, further comprising:
depositing a second gate on the base substrate; wherein the second gate is located between the base substrate and the buffer layer, the buffer layer covers the second gate, and along the second direction, an extension width of the second gate is greater than an extension width of the first gate; and
depositing a passivation layer on the interlayer insulation layer, the source and the drain.

8. A display panel, comprising: an OLED device and an array substrate; wherein the OLED device is stacked above the array substrate, and the array substrate comprising:
a base substrate; and
a buffer layer, an active layer, a gate insulation layer, and a first gate that are sequentially laminated on the base substrate along a first direction, where the active layer comprises a first active layer and two second active layers respectively located on two sides of the first active layer; wherein the two second active layers are respectively deposited at two sides of the first active layer;

wherein along the first direction, the two second active layers overlap with the two sides of the first active layer respectively, the first gate is a conductive mask of the second active layer, the first active layer remains as an oxide semiconductor and forms a channel region, a conductive portion is formed on each of the two second active layers, and the two second active layers are made of conductor material; and along a second direction, an extension width of the first active layer is greater than an extension width of the first gate, and the first direction intersects with the second direction;

wherein an interlayer insulation layer is provided on the buffer layer, the interlayer insulation layer covers the first gate, the two second active layers and the gate insulation layer; and the interlayer insulation layer is provided with two through holes respectively arranged above the two second active layers;

wherein a source and a drain are respectively arranged on the interlayer insulation layer, and the source and the drain are respectively connected to the corresponding two conductive portions of the two second active layers through the two through holes; and wherein along the first direction, two sides of the first gate respectively coincide with one side of each of the two second active layers, the channel region is formed between parts of the second active layers coincided with the first gate and the first active layer, and the two conductive portions are formed at parts of the two second active layers that are not coincided with the first gate;

or the array substrate prepared based on a preparation method comprising:

sequentially depositing a buffer layer, an active layer, a gate insulation layer and a first gate on a base substrate along a first direction; wherein the active layer comprises a first active layer and two second active layers respectively located on two sides of the first active layer;

along the first direction, the two second active layers overlap with the two sides of the first active layer respectively, and along a second direction, an extension width of the first active layer is greater than an extension width of the first gate, and the first direction intersects with the second direction;

conducting the two second active layers using the first gate as a mask; wherein the first active layer remains as an oxide semiconductor and forms a channel region, and two conductive portions made of conductor material are respectively formed on the two second active layers;

depositing an interlayer insulation layer to enable the interlayer insulation layer to cover the buffer layer, the first gate, the two second active layers and the gate insulation layer; and exposing and developing on the interlayer insulation layer to form two through holes directly reaching the two conductive portions of the two second active layers, respectively; and depositing a source and a drain on the interlayer insulation layer and in the two through holes;

wherein along the first direction, two sides of the first gate respectively coincide with one side of each of the two second active layers; and the channel region is formed between parts of the second active layers coincided with the first gate and the first active layer, and the two conductive portions are formed at parts of the two second active layers that are not coincided with the first gate;

wherein the step of depositing sequentially to form the buffer layer, the active layer, the gate insulation layer and the first gate on the base substrate specifically comprises:

sequentially depositing the buffer layer and the first active layer on the base substrate; and sequentially depositing the two second active layers at two sides of the first active layer respectively, wherein along the first direction, the two second active layers overlap with two sides of the first active layer respectively.

9. The display panel according to claim 8, wherein along the second direction, the extension width of the first gate is less than an extension width of the gate insulation layer; and the extension width of the first active layer is greater than the extension width of the gate insulation layer.

10. The display panel according to claim 8, wherein the array substrate further comprises:

a second gate, located between the base substrate and the buffer layer, the buffer layer covers the second gate, and along the second direction, an extension width of the second gate is greater than the extension width of the first gate.

11. The display panel according to claim 8, wherein the array substrate further comprises:

a passivation layer, covering the interlayer insulation layer, the source and the drain.

* * * * *